(12) United States Patent
Maeda et al.

(10) Patent No.: US 8,363,687 B2
(45) Date of Patent: *Jan. 29, 2013

(54) VERTICAL CAVITY SURFACE EMITTING LASER

(75) Inventors: Osamu Maeda, Kanagawa (JP); Masaki Shiozaki, Kanagawa (JP); Takahiro Arakida, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/064,788

(22) Filed: Apr. 15, 2011

(65) Prior Publication Data

US 2011/0194579 A1 Aug. 11, 2011

Related U.S. Application Data

(63) Continuation of application No. 12/318,421, filed on Dec. 29, 2008, now Pat. No. 8,077,752.

(30) Foreign Application Priority Data

Jan. 10, 2008 (JP) ................................. 2008-002822
Nov. 28, 2008 (JP) ................................. 2008-305349

(51) Int. Cl.
*H01S 5/00* (2006.01)
(52) U.S. Cl. ............... 372/45.01; 372/43.01; 372/44.01; 372/45.012; 372/50.1; 372/46.013; 372/46.015; 372/46.016
(58) Field of Classification Search .............. 372/43.01, 372/44.01, 45.01, 50.1, 50.124, 46.013, 46.015, 372/46.016

See application file for complete search history.

(56) References Cited

U.S. PATENT DOCUMENTS

| 5,594,751 | A | 1/1997 | Scott |
| 6,727,520 | B2 | 4/2004 | Morgan et al. |
| 6,865,203 | B2 * | 3/2005 | Yoshida et al. ............ 372/46.01 |
| 6,959,025 | B2 | 10/2005 | Jikutani et al. |
| 6,999,650 | B2 | 2/2006 | Kato |

(Continued)

FOREIGN PATENT DOCUMENTS

| JP | 06-283818 A | 10/1994 |
| JP | 2001-156395 | 6/2001 |

(Continued)

OTHER PUBLICATIONS

WO2007142184 (English translation).*

(Continued)

*Primary Examiner* — Jessica Stultz
*Assistant Examiner* — Delma Forde
(74) *Attorney, Agent, or Firm* — Rader, Fishman & Grauer PLLC

(57) ABSTRACT

A Vertical Cavity Surface Emitting Laser (VCSEL) capable of providing high output of fundamental transverse mode while preventing oscillation of high-order transverse mode is provided. The VCSEL includes a semiconductor layer including an active layer and a current confinement layer, and a transverse mode adjustment section formed on the semiconductor layer. The current confinement layer has a current injection region and a current confinement region. The transverse mode adjustment section has a high reflectance area and a low reflectance area. The high reflectance area is formed in a region including a first opposed region opposing to a center point of the current injection region. A center point of the high reflectance area is arranged in a region different from the first opposed region. The low reflectance area is formed in a region where the high reflectance area is not formed, in an opposed region opposing to the current injection region.

13 Claims, 14 Drawing Sheets

U.S. PATENT DOCUMENTS

| | | | |
|---|---|---|---|
| 7,499,481 B2 | 3/2009 | Ikuta | |
| 7,920,615 B2 * | 4/2011 | Maeda et al. | 372/46.013 |
| 2002/0141472 A1 * | 10/2002 | Koyama et al. | 372/96 |
| 2002/0181536 A1 * | 12/2002 | Jeon | 372/96 |
| 2003/0210853 A1 * | 11/2003 | Kato | 385/18 |
| 2005/0013334 A1 * | 1/2005 | Watanabe et al. | 372/44 |
| 2007/0014324 A1 * | 1/2007 | Maeda et al. | 372/46.01 |
| 2007/0153865 A1 * | 7/2007 | Maeda et al. | 372/50.124 |
| 2008/0232414 A1 * | 9/2008 | Masui et al. | 372/44.01 |
| 2008/0240194 A1 * | 10/2008 | Maeda et al. | 372/50.1 |
| 2009/0129417 A1 | 5/2009 | Maeda et al. | |
| 2009/0180506 A1 * | 7/2009 | Maeda et al. | 372/44.01 |
| 2010/0040104 A1 * | 2/2010 | Maeda et al. | 372/50.124 |
| 2010/0046565 A1 * | 2/2010 | Masui et al. | 372/45.01 |
| 2010/0226402 A1 * | 9/2010 | Maeda et al. | 372/45.01 |
| 2011/0007769 A1 * | 1/2011 | Masui et al. | 372/46.013 |

FOREIGN PATENT DOCUMENTS

| | | | |
|---|---|---|---|
| JP | 2001-210908 | | 8/2001 |
| JP | 2002-359432 A | | 12/2002 |
| JP | 2004-119582 | | 4/2004 |
| JP | 2004-241422 A | | 8/2004 |
| JP | 2004-356271 A | | 12/2004 |
| JP | 2005-086170 A | | 3/2005 |
| JP | 2005-150442 A | | 6/2005 |
| JP | 2005-159272 A | | 6/2005 |
| JP | 2005-347715 A | | 12/2005 |
| JP | 2006-210429 A | | 8/2006 |
| JP | 2007-201398 A | | 8/2007 |
| JP | 2008-016824 A | | 1/2008 |
| JP | 2008-085301 A | | 4/2008 |
| JP | 2008-108827 A | | 5/2008 |
| JP | 2010135854 | * | 7/2010 |
| WO | WO2007142184 | * | 12/2007 |

OTHER PUBLICATIONS

WO 2007/142184, English translation.*

Japanese Office Action issued Jan. 12, 2010 for corresponding Japanese Applcation No. 2008-305349.

R. A. Morgan et al, "Transverse mode control of vertical cavity top surface emitting laser", IEEE Photonic technology letters, vol. 4, No. 4, Apr. 1993, pp. 374-377.

D. L. Huffaker et al, "Transverse mode behavior in native-oxide defined low threshold vertical cavity lasers" Appl. Phys. Lett. 65 (13) Sep. 26, 1994, pp. 1611-1613.

Nobuhiko Nishiyama et al, "Multi-oxide layer structure for single-mode operation in vertical cavity surface emitting lasers" IEEE Photonic Technology letters, vol. 12, No. 6, Jun. 2000, pp. 606-608.

* cited by examiner

VERTICAL CAVITY SURFACE EMITTING LASER

CROSS REFERENCES TO RELATED APPLICATIONS

The present invention is a Continuation of application Ser. No. 12/318,421, filed Dec. 29, 2008, which contains subject matter related to Japanese Patent Application JP 2008-002822 filed in the Japanese Patent Office on Jan. 10, 2008, and Japanese Patent Application JP 2008-305349 filed in the Japanese Patent Office on Nov. 28, 2008, the entire contents of which being incorporated herein by references.

BACKGROUND OF THE INVENTION

1. Field of the Invention

The present invention relates to a Vertical Cavity Surface Emitting Laser (VCSEL) that emits laser light from the top face, particularly to a VCSEL suitably applicable to purposes necessitating transverse mode control.

2. Description of the Related Art

A VCSEL emits light in the direction orthogonal to a substrate differently from the existing edge-emitting laser diodes. In the VCSEL, many devices are able to be arranged in a state of a two dimensional array on the same substrate. Therefore, the VCSEL has recently attracted attention as a light source for a digital copy machine or a printer.

In the past, in the foregoing type of VCSEL, a pair of multilayer film reflectors is formed over a semiconductor substrate, and an active layer as a light emitting region is provided between the pair of multilayer film reflectors. In one of the multilayer film reflectors, in order to improve efficiency of current injection into the active layer and lower the threshold value current, a current confinement layer having a structure in which a current injection region is confined is provided. Further, a lower electrode is provided on the bottom face side, and a p-side electrode is provided on the top face side. The p-side electrode is provided with a light emitting aperture to emit laser light. In the VCSEL, a current is confined by the current confinement layer, and then injected into the active layer where light is emitted. While the emitted light repeats reflection between the pair of multilayer film reflectors, the light is emitted as laser light from the light emitting aperture of the p-side electrode.

In general, in the foregoing VCSEL, high-order transverse mode oscillation is easily generated. Therefore, for example, in Japanese Unexamined Patent Application Publication No. 2004-119582, a reflectance adjustment layer is provided in the central part of a light emitting aperture of the top face of a mesa, a region where fundamental transverse mode is mainly shown is set to a region with high reflectance, and a region where high-order transverse mode is mainly shown is set to a region with low reflectance. Thereby, oscillation of the high-order transverse mode is prevented, and single transverse mode oscillation is realized.

SUMMARY OF THE INVENTION

However, the foregoing measure of Japanese Unexamined Patent Application Publication No. 2004-119582, in the region where the high-order transverse mode is mainly shown, oscillation of the fundamental transverse mode is prevented. Thus, there is a disadvantage that it is not easy to obtain high output of the fundamental transverse mode.

In view of the foregoing, in the invention, it is desirable to provide a VCSEL capable of obtaining high output of the fundamental transverse mode while preventing oscillation of the high-order transverse mode.

According to an embodiment of the present invention, there is provided a first Vertical Cavity Surface Emitting Laser including a semiconductor layer including an active layer and a current confinement layer; and a transverse mode adjustment section formed on the semiconductor layer. The current confinement layer has a current injection region and a current confinement region. The transverse mode adjustment section has a high reflectance area and a low reflectance area. The high reflectance area is formed in a region including a first opposed region opposing to a center point of the current injection region, and a center point of the high reflectance area is arranged in a region different from the first opposed region. On the other hand, the low reflectance area is formed in a region where the high reflectance area is not formed, in an opposed region opposing to the current injection region.

In the first VCSEL of the embodiment of the invention, in the transverse mode adjustment section on the semiconductor layer, the high reflectance area is formed in the region including a first opposed region opposing to a center point of the current injection region, and a center point of the high reflection region is arranged in a region different from the first opposed region. On the other hand, the low reflectance area is formed in a region where the high reflectance area is not formed, in an opposed region opposing to the current injection region. This enables to lower the reflectance of the specific region in an opposed region opposing to the region generating a high order transverse mode including four peaks of double rotation symmetry or quad rotation symmetry than the reflectance of the region including the first opposed region. In the case where the specific region is the region corresponding to two peaks facing each other with a region other than the first opposed region in between, gain of the high order transverse mode is able to be largely decreased while minimizing the lowering of gain of the fundamental transverse mode.

The double rotation symmetry means that the number of rotational positions symmetric to the position before rotation while a rotation object is rotated by 360 degree is two. The quad rotation symmetry means that the number of rotational positions symmetric to the position before rotation while a rotation object is rotated by 360 degree is four.

According to an embodiment of the present invention, there is provided a second A Vertical Cavity Surface Emitting Laser including a semiconductor layer including an active layer and a current confinement layer, and a transverse mode adjustment section formed on the semiconductor layer. The current confinement layer has a current injection region and a current confinement region. The transverse mode adjustment section has a high reflectance area and a low reflectance area. The high reflectance area is formed in a region including a first opposed region opposing to a center point of the current injection region, and has a shape of cross. On the other hand, the low reflectance area is formed in a region where the high reflectance area is not formed, in an opposed region opposing to the current injection region.

In the second VCSEL of the embodiment of the invention, in the transverse mode adjustment section on the semiconductor layer, the high reflectance area is formed in the region including a first opposed region opposing to a center point of the current injection region, and has a shape of cross. On the other hand, the low reflectance area is formed in a region where the high reflectance area is not formed, in an opposed region opposing to the current injection region. This enables to lower the reflectance of the specific region in an opposed region opposing to the region generating a high order transverse mode including four peaks of double rotation symmetry or quad rotation symmetry than the reflectance of the region including the first opposed region. In the case where the specific region is the region corresponding to the four peaks, gain of the high order transverse mode is able to be largely decreased while minimizing the lowering of gain of the fundamental transverse mode.

According to the first and the second VCSELs of the embodiment of the invention, the gain of the high-order transverse mode is largely lowered while minimizing the lowering of the gain of the fundamental transverse mode. Therefore, high output of the fundamental transverse mode is able to be obtained while oscillation of the high-order transverse mode is prevented.

DETAILED DESCRIPTION OF THE PREFERRED EMBODIMENT

Descriptions will be given of an embodiment of the invention in detail with reference to the drawings.

Figure 1:
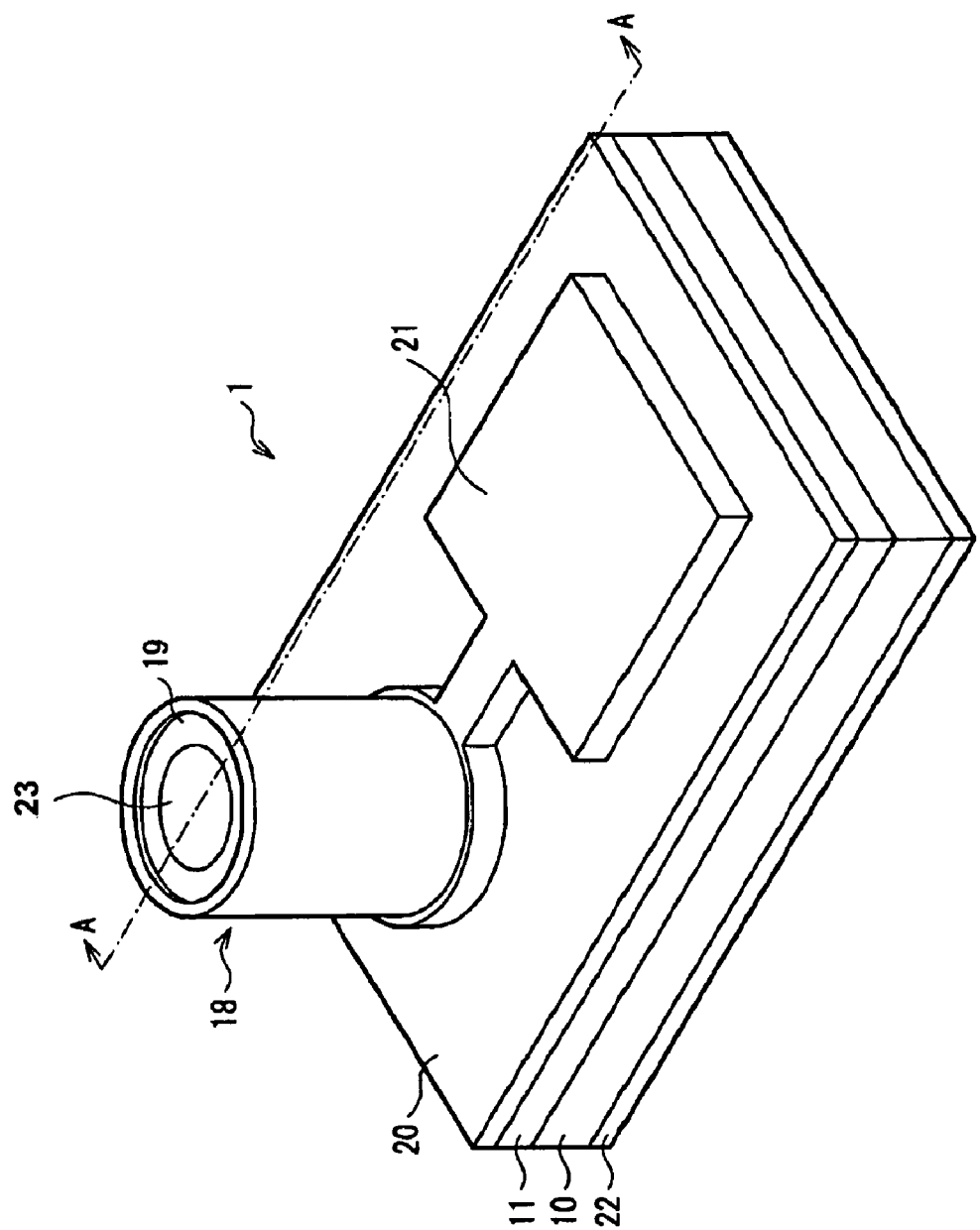
FIG. 1 is a perspective view of a laser diode according to an embodiment of the invention.
Figure 2:
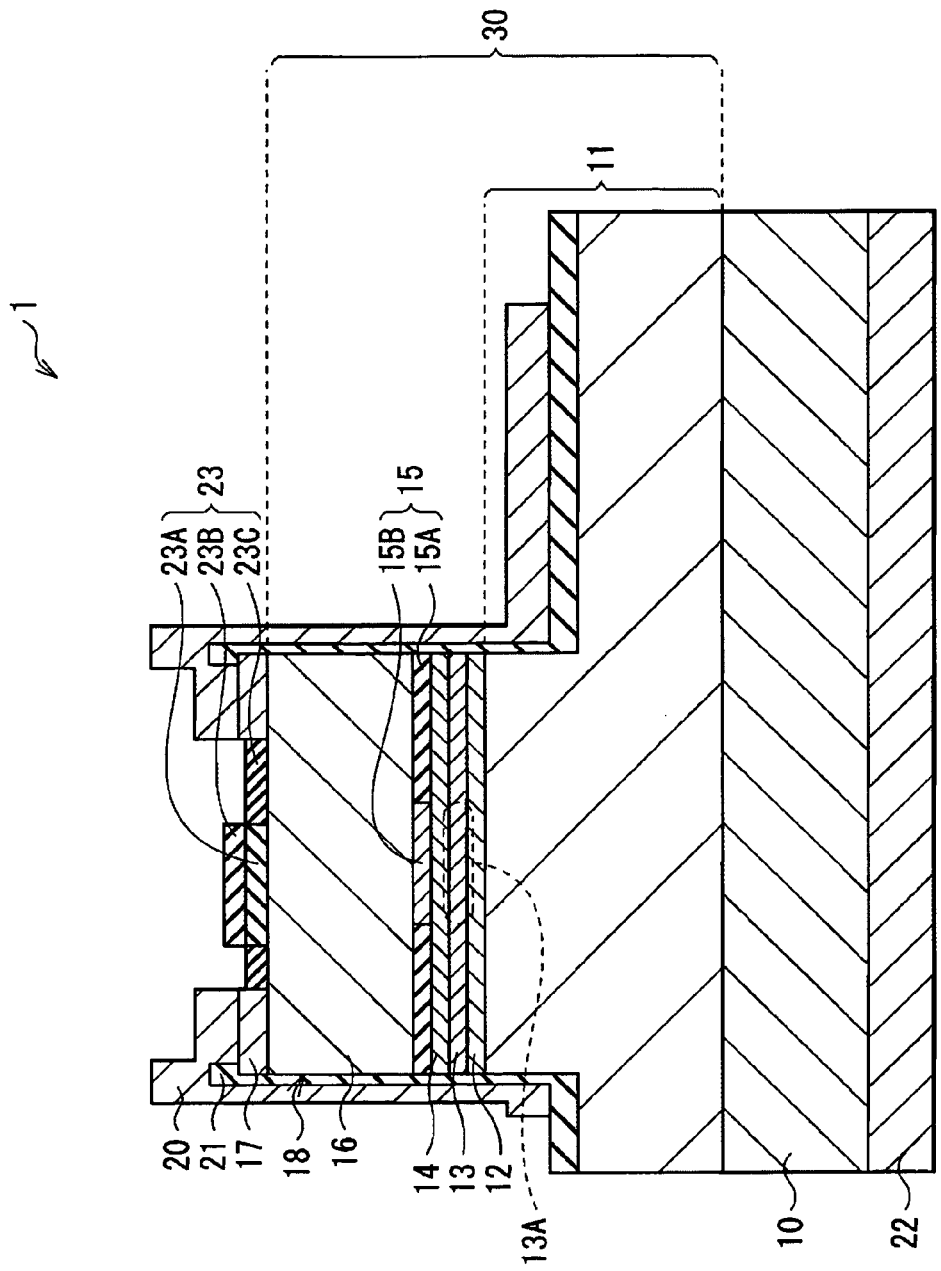
FIG. 2 is a cross sectional view taken along arrows A-A of the laser diode of FIG. 1.
Figure 3A:
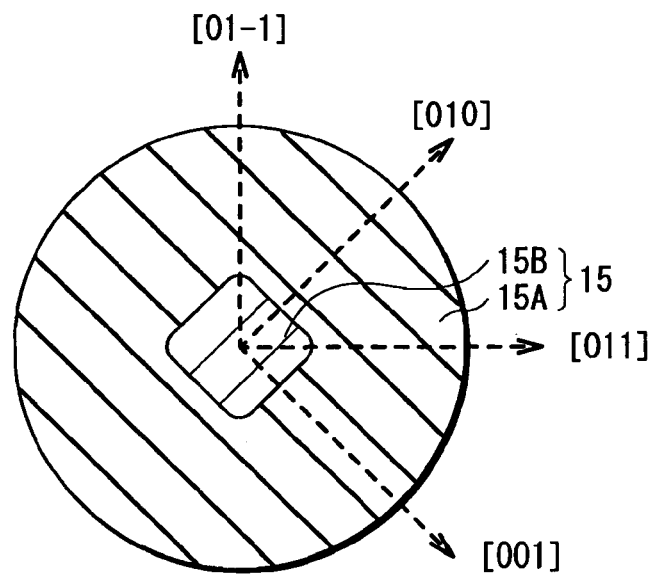
FIGS. 3A to 3C are plan structural views of the current confinement layer of FIG. 2.
Figure 3B:
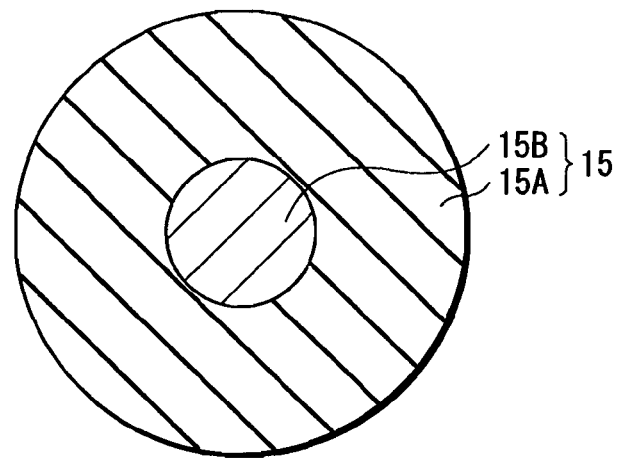
Figure 3C:
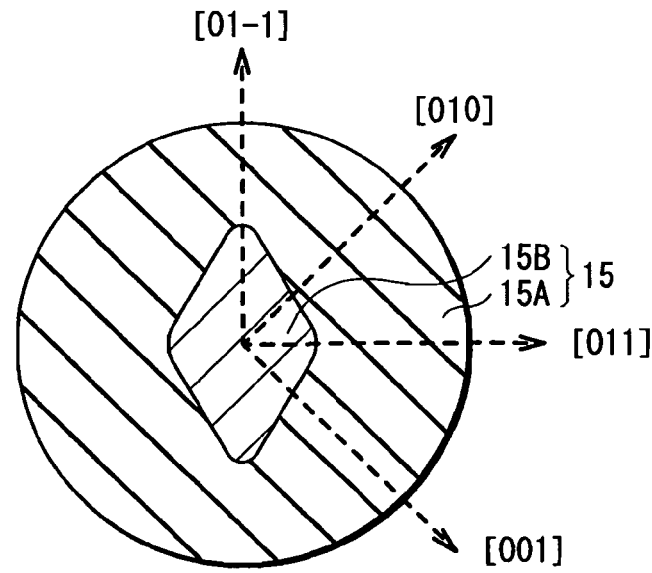

FIG. 1 illustrates a perspective view of a laser diode 1 of VCSEL according to an embodiment of the invention. FIG. 2 illustrates a cross sectional structure taken along arrows A-A of the laser diode 1 of FIG. 1. FIG. 3A to FIG. 3C illustrate a cross sectional structure in the lamination in-plane direction of a current confinement layer 15 of FIG. 2. FIG. 1 to FIG. 3C are schematic views, and thus the dimensions and the shapes thereof are different from the actual dimensions and the actual shapes.

The laser diode 1 includes a semiconductor layer 30 (resonator) in which a lower DBR layer 11, a lower spacer layer 12, an active layer 13, an upper spacer layer 14, the current confinement layer 15, an upper DBR layer 16, and a contact layer 17 are layered in this order on one face of a substrate 10. The upper part of the semiconductor layer 30, specifically, the upper part of the lower DBR layer 11, the lower spacer layer 12, the active layer 13, the upper spacer layer 14, the current confinement layer 15, the upper DBR layer 16, and the contact layer 17 structure a mesa 18. In this embodiment, the lower DBR layer 11 corresponds to a specific example of "a first multilayer film reflector" of the invention and the current confinement layer 15 and the upper DBR layer 16 correspond to a specific example of "a second multilayer film reflector" of the invention.

The substrate 10 is formed from, for example, n-type GaAs. The lower DBR mirror layer 11 is formed by layering a plurality of sets of a low refractive index layer (not illustrated) and a high refractive index layer (not illustrated). The low refractive index layer is formed from n-type $Al_{x1}Ga_{1-x1}$As ($0<x1<1$) being $\lambda/4n_a$ thick ($\lambda$ is an oscillation wavelength, and $n_a$ is a refractive index), for example. The high refractive index layer is formed from n-type $Al_{x2}Ga_{1-x2}$As ($0<x2<1$) being $\lambda/4n_b$ thick ($n_b$ is a refractive index), for example. The lower spacer layer 12 is formed from, for example, $Al_{x3}Ga_{1-x3}$As ($0<x3<1$). As an n-type impurity included in the substrate 10, the lower DBR layer 11, and the lower spacer layer 12, for example, silicon (Si), selenium (Se) or the like is included.

The active layer 13 is made of, for example, a GaAs-based material. In the active layer 13, the central part in the lamination in-plane direction (the region opposed to an aftermentioned current injection region 15B) is a light emitting region 13A. In the light emitting region 13A, the central region corresponds to a region where fundamental transverse mode oscillation is mainly generated, and the region surrounding the central region is a region where high-order transverse mode oscillation is mainly generated.

The upper spacer layer 14 is formed from, for example, p-type $Al_{x4}Ga_{1-x4}$As ($0 \leq x4<1$). The upper DBR layer 16 is formed by layering a plurality of sets of the low refractive index layer (not illustrated) and the high refractive index layer (not illustrated). The uppermost layer of the upper DBR layer 16 is the high refractive index layer. The low refractive index layer is formed from p-type $Al_{x5}Ga_{1-x5}$As ($0<x5<1$) being $\lambda/4n_c$ thick ($n_c$ is a refractive index), for example. The high refractive index layer is formed from p-type $Al_{x6}Ga_{1-x6}$As ($0<x6<x5$) being $\lambda/4n_d$ thick ($n_d$ is a refractive index), for example. The contact layer 17 is made of, for example, p-type GaAs, and is provided with, for example, a circular aperture in a region opposed to the after-mentioned current injection region 15B. As a p-type impurity included in the upper spacer layer 14, the upper DBR layer 16, and the contact layer 17, zinc (Zn), magnesium (Mg), beryllium (Be) or the like is included.

The current confinement layer 15 has a current confinement region 15A in a region with a certain depth from the side face of mesa 18, and the other region thereof (central region of the mesa 18) is the current injection region 15B. The current injection region 15B is formed from, for example, p-type $Al_{x7}Ga_{1-x7}$As ($0<x7 \leq 1$). The current confinement region 15A contains, for example, $Al_2O_3$ (aluminum oxide) and is obtained by oxidizing highly concentrated Al included in an oxidized layer 15D from the side face as will be described later. Therefore, the current confinement layer 15 has a function to confine a current.

Further, for example, as illustrated in FIG. 3A, the current injection region 15B is in the shape of a quadrangle (regular tetragon) having diagonal lines in the directions of [011] and [01-1], and has in-plane anisotropy. This is because, for example, the oxidation rate of $Al_{x7}Ga_{1-x7}As$ in the directions of [011] and [01-1] is different from that in the directions of [001] and [010] at an angle of 45 degrees with the directions of [011] and [01-1]. The length of the diagonal lines of the quadrangle is, for example, in the range about from 3 μm to 10 μm, both inclusive.

The current injection region 15B may be, for example, as illustrated in FIG. 3B, circular. Otherwise, for example, as illustrated in FIG. 3C, the current injection region 15B may be in the shape of a quadrangle (rhombus) having diagonal lines in the directions of [011] and [01-1].

The mesa 18 includes the current injection region 15B of the current confinement layer 15, and for example, is in the shape of a cylinder being about 20 μm to 30 μm in diameter, both inclusive. The diameter is appropriately adjusted according to oxidation rate, oxidation time and the like in the oxidation step so that a non-oxidized region (current injection region 15B) having a certain size is left inside the mesa 18 in the after-mentioned oxidation step.

On the top face of the mesa 18 (top face of the contact layer 17), a circular upper electrode 19 having an aperture in a region opposed to the current injection region 15B is formed. On the side face and the surrounding surface of the mesa 18, a protective film 20 is formed. On the surface of the protective film 20, an electrode pad 21 for bonding a wire (not illustrated) is provided. The electrode pad 21 is electrically connected to the upper electrode 19. Further, on the rear face of the substrate 10, a lower electrode 22 is provided. The upper electrode 19 and the electrode pad 21 are formed by layering, for example, titanium (Ti), platinum (Pt), and gold (Au) in this order, and are electrically connected to the contact layer 17 located in the upper part of the mesa 18. The lower electrode 22 has a structure in which, for example, an alloy of gold (Au) and germanium (Ge), nickel (Ni), and gold (Au) are layered in this order from the substrate 10 side, and is electrically connected to the substrate 10.

In this embodiment, in the aperture of the upper electrode 19, that is, in the central region of the top face of the mesa 18, a transverse mode adjustment section 23 is provided. The transverse mode adjustment layer 23 is provided being contacted with the uppermost layer of the upper DBR layer 16, and includes a first adjustment layer 23A, a second adjustment layer 23B, and a third adjustment layer 23C.

The first adjustment layer 23A is made of a material in which the film thickness is $(2a-1)\lambda/4n_1$ (a is an integer number of 1 or more, and $n_1$ is a refractive index) and the refractive index $n_1$ is lower than the refractive index of the high refractive index layer provided on the surface of the upper DBR layer 16, for example, a dielectric material such as $SiO_2$ (silicon oxide). The second adjustment layer 23B is made of a material in which the film thickness is $(2b-1)\lambda/4n_2$ (b is an integer number of 1 or more, and $n_2$ is a refractive index) and the refractive index $n_2$ is higher than the refractive index $n_1$ of the first adjustment layer 23A, for example, a dielectric material such as SiN (silicon nitride). Therefore, the laminated structure composed of the first adjustment layer 23A and the second adjustment layer 23B has a function to reflect light from the active layer 13 at high reflectance.

The third adjustment layer 23C is made of a material in which the film thickness is $(2c-1)\lambda/4n_3$ (c is an integer number of 1 or more, and $n_3$ is a refractive index) and the refractive index $n_3$ is higher than the refractive index $n_1$ of the first adjustment layer 23A, for example, a dielectric material such as SiN (silicon nitride). Therefore, the third adjustment layer 23C has a function to reflect light from the active layer 13 at lower reflectance than that of the laminated structure composed of the first adjustment layer 23A and the second adjustment layer 23B.

The second adjustment layer 23B and the third adjustment layer 23C preferably have the same film thickness and are preferably made of the same material. Thereby, as will be described later, these layers are able to be formed collectively, and the manufacturing step is simplified.

Figure 4A:
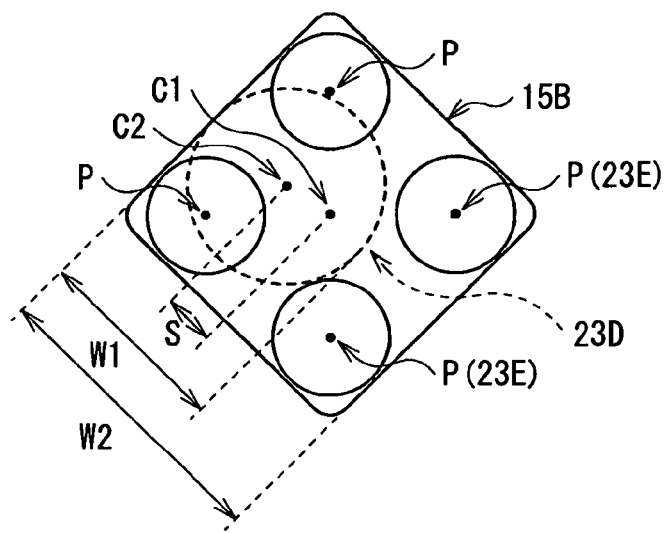
FIGS. 4A to 4C are schematic views for explaining a relation between the transverse mode adjustment section of FIG. 2 and high-order transverse mode.
Figure 4B:
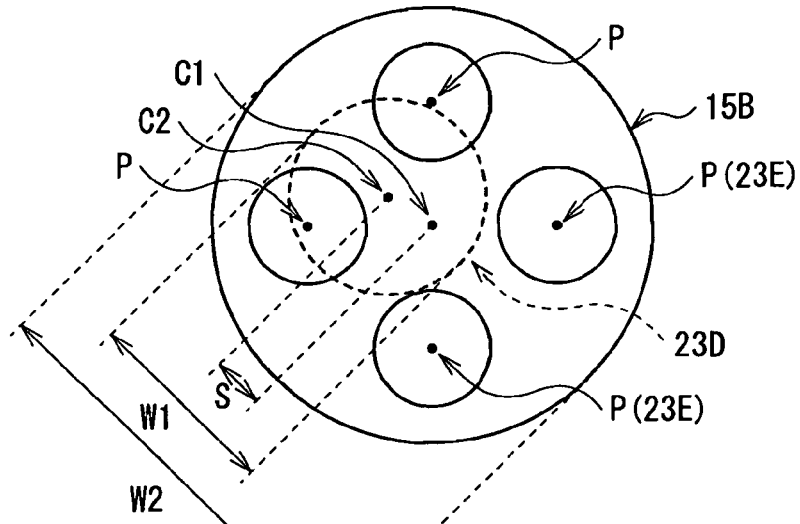
Figure 4C:
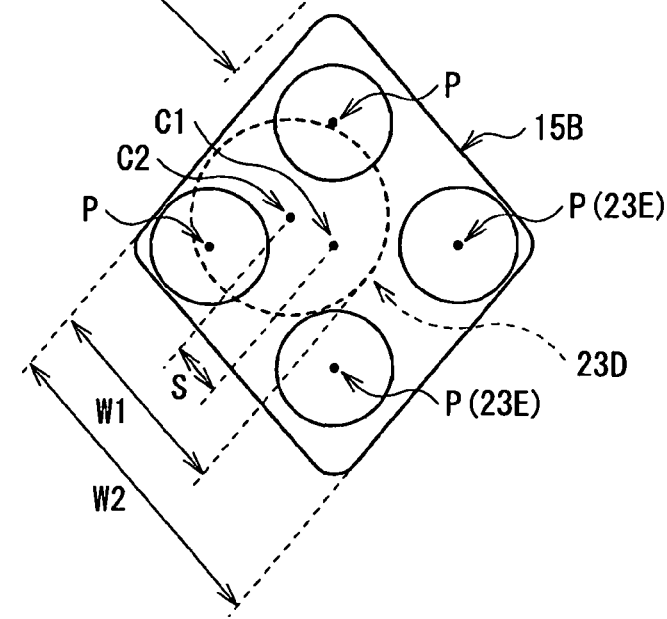

In this embodiment, a laminated structure 23D (high reflectance area) composed of the first adjustment layer 23A and the second adjustment layer 23B is circular, for example, as illustrated in FIGS. 4A, 4B, and 4C. The laminated structure 23D is formed in a region including an opposed region C1 (first opposed region) opposing to the center point of the current injection region 15B, and is arranged so that a center point C2 of the laminated structure 23D is located in a region different from the opposed region C1.

More specifically, the first adjustment layer 23A and the second adjustment layer 23B are arranged in a region to avoid a specific region 23E (in a region other than the specific region 23E) that corresponds to two peaks P opposed with a region other than the opposed region C1 in between, in an opposed region opposing to a region where high-order transverse mode (primary mode) including four peaks P of double rotation symmetry or quad rotation symmetry. Meanwhile, the third adjustment layer 23C (low reflectance area) is formed in a region where the first adjustment layer 23A and the second adjustment layer 23B are not formed in an opposed region opposing to the current injection region 15B, that is, in a region including the foregoing specific region 23E.

Figure 5:
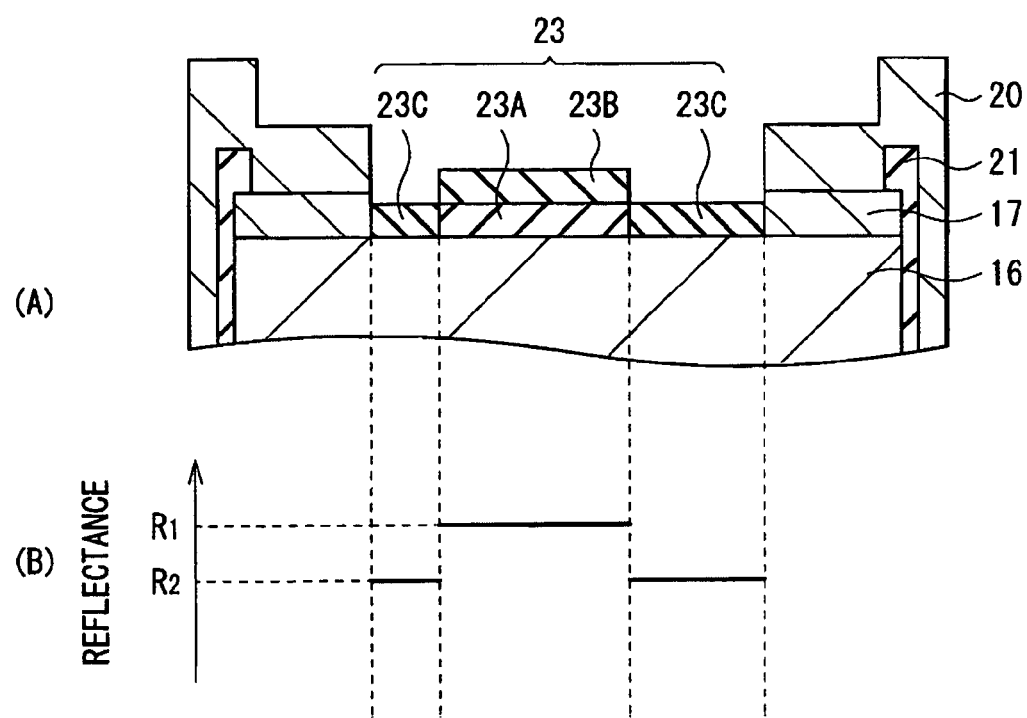
FIG. 5 is a distribution view for explaining reflectance distribution of the transverse mode adjustment section of FIG. 2.

Therefore, as illustrated in FIG. 5, in the transverse mode adjustment section 23, reflectance $R_2$ in the third adjustment layer 23C (region including the specific region 23E) is lower than reflectance $R_1$ in the laminated structure 23D (the opposed region C1) composed of the first adjustment layer 23A and the second adjustment layer 23B.

A width $W_1$ (diameter) of the laminated structure 23D is preferably in the range satisfying the following Formula 1, where a length (or diameter) of the diagonal line (in the short axis direction) of the current injection region 15B is $W_2$. Further, a difference (shift length) S between the center of the first adjustment layer 23A and the second adjustment layer 23B and the center point of the current injection region 15B is preferably in the range satisfying the following Formula 2.

$$W_1 \geq 0.6 \times W_2 \quad \text{Formula 1}$$

$$S \geq 0.1 \times W_2 \quad \text{Formula 2}$$

Further, where the reflectance in the case where the foregoing adjustment layers are not provided in the aperture of the upper electrode 19 is $R_3$, each refractive index is preferably adjusted to satisfy the following Formula 3. Thereby, high-order transverse mode oscillation is able to be selectively prevented without decreasing the light output of the fundamental transverse mode.

$$R_1 \geq R_3 > R_2 \quad \text{Formula 3}$$

The laser diode 1 according to this embodiment may be manufactured, for example, as follows.

FIGS. 6A and 6B to FIGS. 8A and 8B illustrate the manufacturing method in the order of steps. FIGS. 6A and 6B to FIGS. 8A and 8B respectively illustrate a structure of a cross section taken along the same direction as the direction of arrows A-A of FIG. 1 of a device in process of manufacture.

Here, compound semiconductor layers made of GaAs over the substrate 10 are formed by MOCVD (Metal Organic Chemical Vapor Deposition) method, for example. As a raw material of Group III-V compound semiconductor, for example, trimethyl aluminum (TMA), trimethyl gallium (TMG), trimethyl indium (TMIn), and arsine (AsH$_3$) are used. As a raw material of a donor impurity, for example, H$_2$Se is used. As a raw material of an acceptor impurity, for example, dimethyl zinc (DMZ) is used.

Figure 6A:
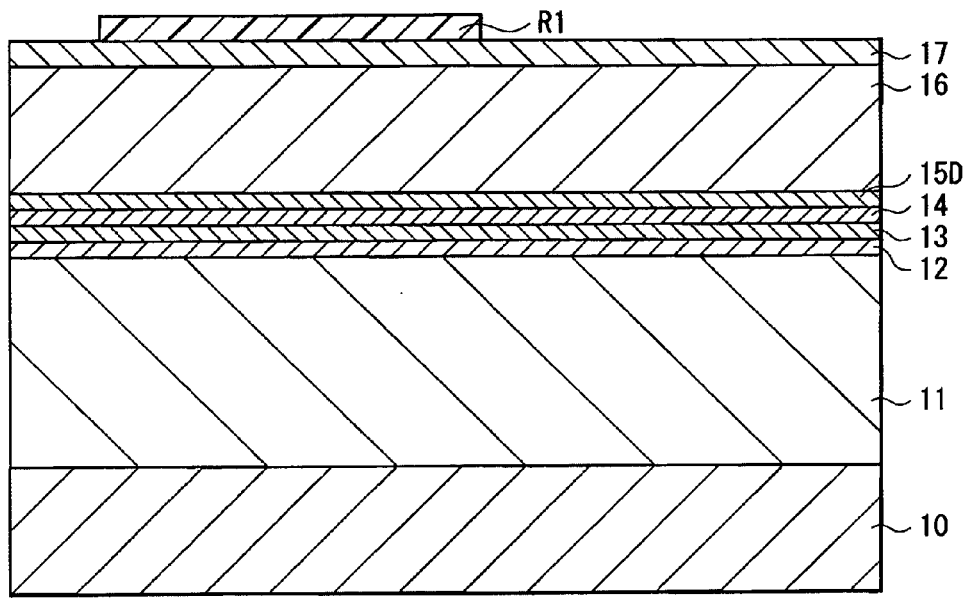
FIGS. 6A and 6B are cross sectional views for explaining manufacturing process of the laser diode illustrated in FIG. 1.

First, the lower DBR layer 11, the lower spacer layer 12, the active layer 13, the upper spacer layer 14, the oxidized layer 15D, the upper DBR layer 16, and the contact layer 17 are layered over the substrate 10 in this order. After that, a resist layer R1 is formed on the contact layer 17 (FIG. 6A).

Figure 6B:
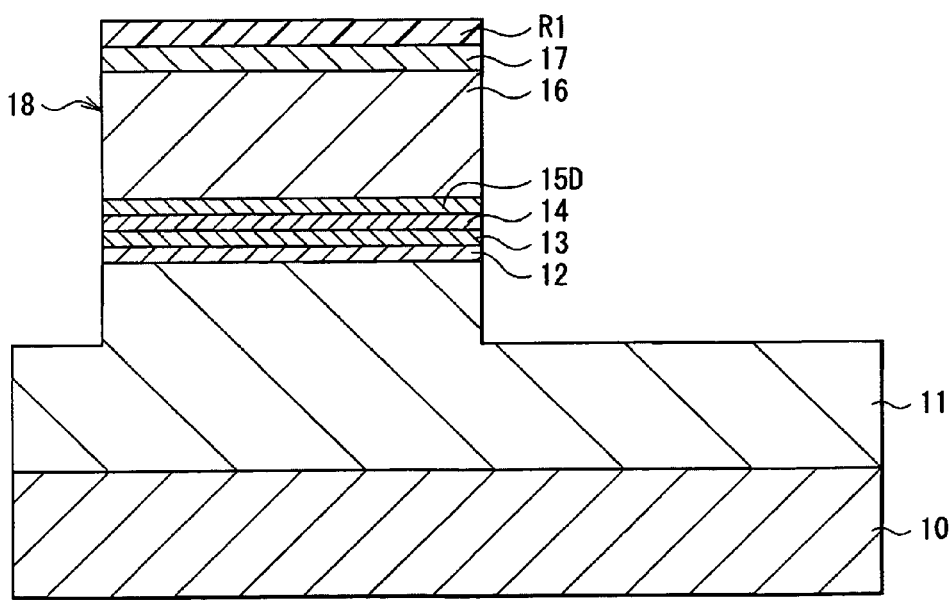

Next, the contact layer 17, the upper DBR layer 16, the oxidized layer 15D, the upper spacer layer 14, the active layer 13, the lower spacer layer 12, and the upper part of the lower DBR layer 11 are selectively etched by, for example, RIE (Reactive Ion Etching) method to form the mesa 18 (FIG. 6B).

Figure 7A:
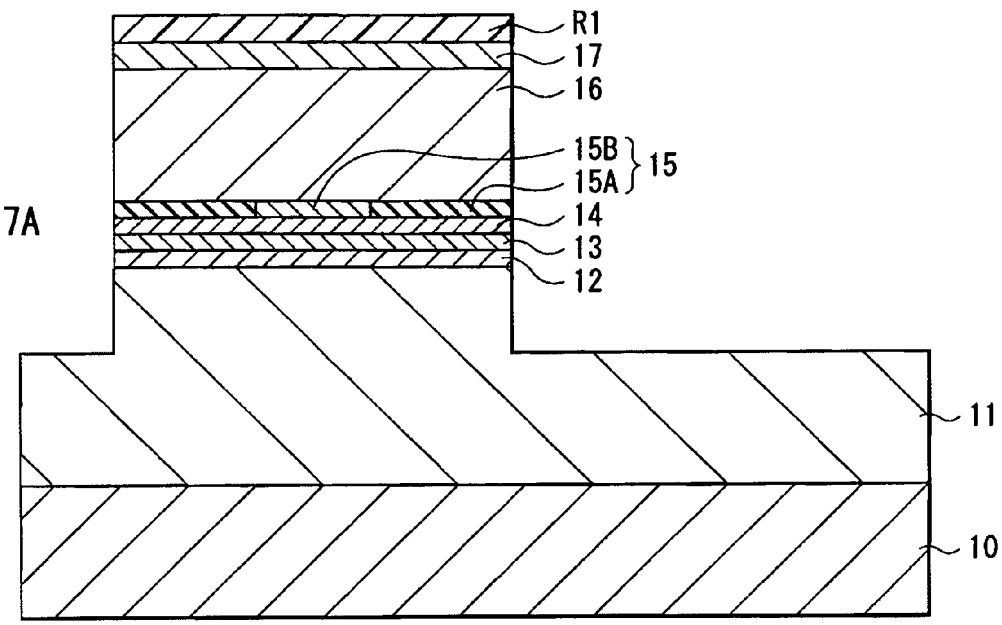
FIGS. 7A and 7B are cross sectional views for explaining steps following the steps of FIGS. 6A and 6B.

Next, oxidation treatment is performed at high temperature in the water vapor atmosphere to selectively oxidize Al of the oxidized layer 15D from the side face of the mesa 18. Thereby, the peripheral region of the oxidized layer 15D becomes an insulating layer (aluminum oxide). That is, the peripheral region becomes the current confinement region 15A, and only the central region becomes the current injection region 15B. Accordingly, the current confinement layer 15 is formed (FIG. 7A). After that, the resist layer R1 is removed.

Figure 7B:
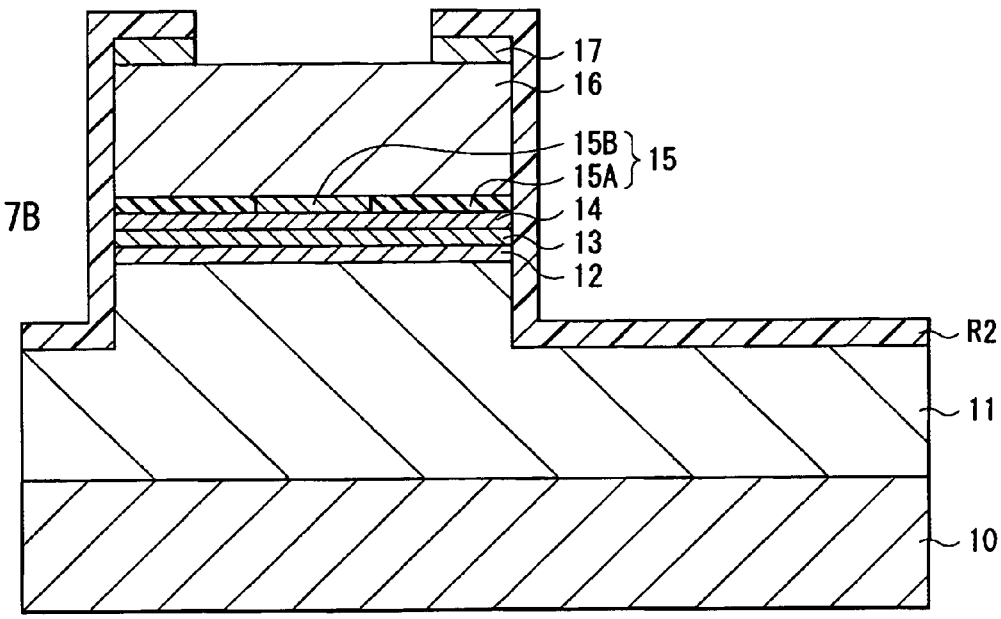

Next, a resist layer R2 is formed on the top of the mesa 18. After that, the central part of the contact layer 17 is selectively removed by, for example, wet etching to form an aperture (FIG. 7B). After that, the resist layer R2 is removed.

Figures 8A, 8B:
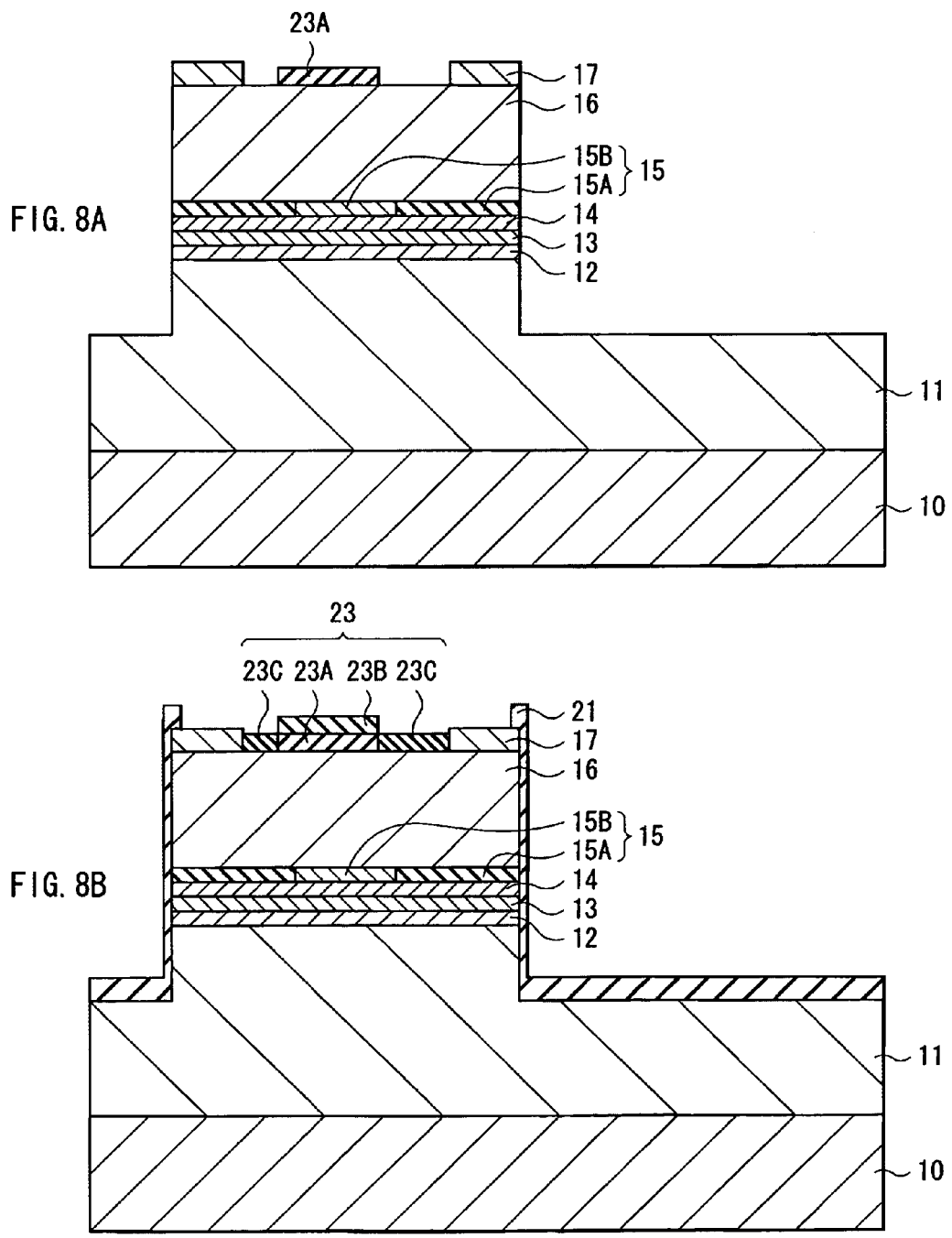
FIGS. 8A and 8B are cross sectional views for explaining steps following the steps of FIGS. 7A and 7B.

Next, the foregoing dielectric material is deposited on the entire surface including the surface of the mesa 18 by, for example, CVD (Chemical Vapor Deposition) method. After that, the deposited dielectric material is selectively removed by etching so that the portion corresponding to the region other than the specific region 23E is left in the top face of the mesa 18. Thereby, the first adjustment layer 23A is formed (FIG. 8A).

Next, by using the method similar to the foregoing method, the second adjustment layer 23B is formed on the first adjustment layer 23A. After that, the third adjustment layer 23C is formed in the specific region 23E of the top face of the mesa 18. Further, the protective film 20 is formed on the side face of the mesa 18 and the surface on the periphery of the mesa 18 (FIG. 8B). The foregoing dielectric material has superior selectivity for semiconductors such as the upper DBR layer 16. Further, the foregoing dielectric material does not need to be formed in a complicated shape. Therefore, the first adjustment layer 23A is able to be easily formed by etching.

In the case where the second adjustment layer 23B, the third adjustment layer 23C, and the protective film 20 have the same film thickness and are made of the same material, these layers are preferably formed collectively in order to simplify the manufacturing process.

Next, the foregoing metal material is layered on the entire surface by, for example, vacuum evaporation method. After that, for example, by selective etching of the metal layer, the upper electrode 19 having an aperture in the central region of the top face of the mesa 18 is formed, and the electrode pad 21 is formed on the surface on the periphery of the mesa 18.

Next, the rear face of the substrate 10 is polished as appropriate and the thickness thereof is adjusted. After that, the lower electrode 22 is formed on the rear face of the substrate 10. Consequently, the laser diode 1 of this embodiment is manufactured.

Next, a description will be given of operation and effect of the laser diode 1.

In the laser diode 1, when a given voltage is applied between the upper electrode 19 and the lower electrode 22, a current is injected into the active layer 13 through the current injection region 15B of the current confinement layer 15. Thereby, light is emitted due to electron-hole recombination. Such light is reflected by the pair of the lower DBR layer 11 and the upper DBR layer 16. Laser oscillation is generated at a given wavelength λ. Then, the light is emitted as a laser beam outside.

In general, in the VCSEL, there is a tendency that light output of the fundamental transverse mode is largest in the central part of the light emitting aperture, and is decreased with distance from the opposed region opposing to the center point of the current injection region. Therefore, in the case where the VCSEL is used for high output purposes, it is preferable that the aperture (light emitting window) of the upper electrode is large enough to extract laser light of the fundamental transverse mode as much as possible. However, in general, there is a tendency that light output of the high-order transverse mode is largest in a region away from the center point of the current injection region at a certain distance, and is decreased with distance from such a region toward the center point of the current injection region Thus, in the case where the light emitting window is excessively large, the laser light of the high-order transverse mode may be also outputted on high output.

Therefore, in the VCSEL of related art, the laser light of the high-order transverse mode is prevented from being emitted by the following measures. That is, the size of the current injection region is decreased. Otherwise, a reflectance adjustment layer is provided in the central part of the light emitting window, and thereby a region where the fundamental transverse mode is mainly shown is set to a region with high reflectance, and a region where high-order transverse mode is mainly shown is set to a region with low reflectance.

Figure 9A:
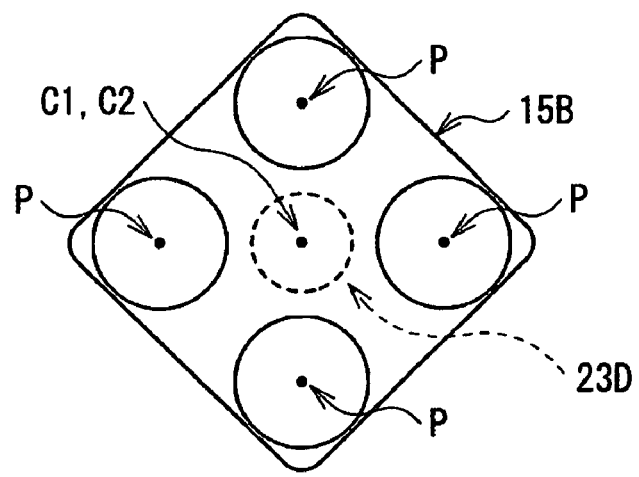
FIGS. 9A and 9B are schematic views for explaining a relation between a transverse mode adjustment section of a comparative example and high-order transverse mode.
Figure 9B:
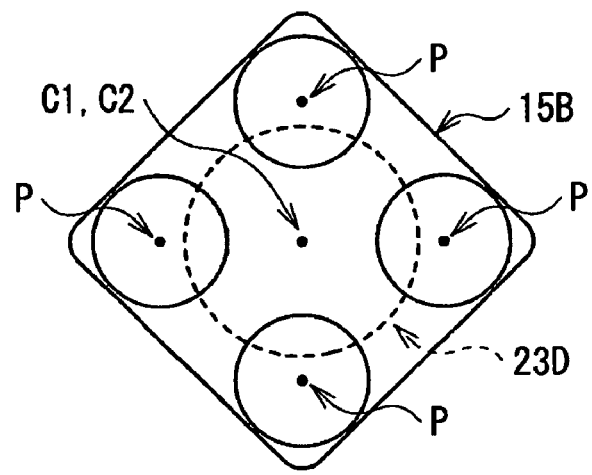
Figure 10:
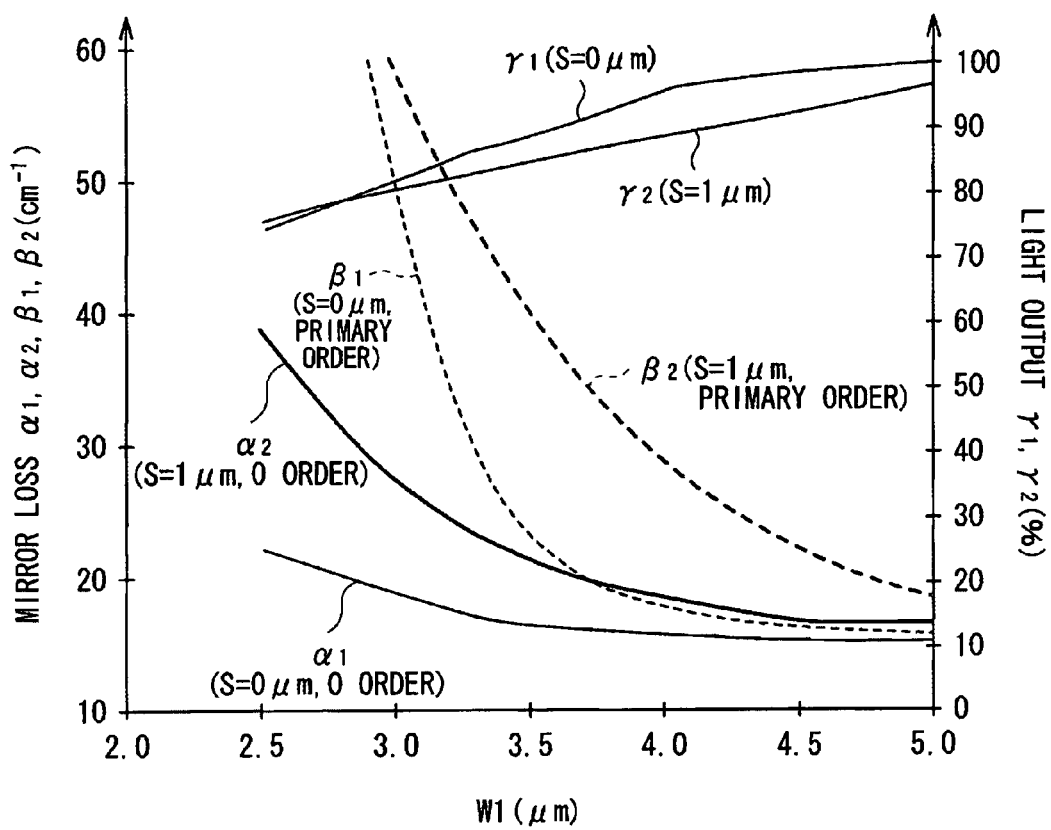
FIG. 10 is a characteristics diagram for explaining a relation between a width of a current confinement layer and mirror loss/light output.

For example, as illustrated in FIGS. 9A and 9B, in the case where the laminated structure 23D is arranged so that the center point C2 of the laminated structure 23D corresponds to the opposed region C1 opposing to the center point of the current injection region 15B, as illustrated in α1 and β1 of FIG. 10, the smaller the width (diameter) W$_1$ of the laminated structure 23D is, the larger the difference between mirror loss of 0 order transverse mode and mirror loss of primary order transverse mode is. However, in the case where the width W$_1$ of the laminated structure 23D is small (for example, 3.2 μm), the light output is lower than 90% of the light output in the case where the transverse mode adjustment section 23 is not provided on the upper DBR layer 16. Meanwhile, however, in the case where the width W$_1$ of the laminated structure 23D is large (for example, 4.5 μm), the light output exceeds 90% of the light output in the case where the transverse mode adjustment section 23 is not provided on the upper DBR layer 16, but the difference between the mirror loss of the 0 order transverse mode and the mirror loss of the primary order transverse mode becomes extremely small, and it is difficult to obtain gain of the high-order transverse mode that is extremely smaller than gain of the fundamental transverse mode. As a result, high-order transverse mode oscillation is generated, and NFP (Near Field Pattern) is distorted. As described above, in the existing method, light output and NFP are in relation of trade-off.

Meanwhile, in this embodiment, the laminated structure 23D is provided in the region other than the specific region 23E in the top face of the mesa 18, and the third adjustment layer 23C is provided in the region including the specific region 23E. Thereby, as illustrated in FIG. 5B, the reflectance in the third adjustment layer 23C (high reflectance area) is lower than the reflectance in the laminated structure 23D (low reflectance area). Thus, in the foregoing primary mode including the four peaks P of double rotation symmetry or quad rotation symmetry, at least one gain out of a pair of peaks opposing with the opposed region C1 in between is inhibited. The foregoing primary mode is a mode in which two sets of a pair of peaks opposing with the opposed region C1 in between are overlapped. Therefore, by suppressing at least one gain out of the two peaks respectively included in each set, gains of each set are able to be suppressed.

For example, in the case where the laminated structure 23D is arranged in the region other than the specific region 23E, and the center point C2 of the laminated structure 23D is deviated from the opposed region C1 by about 1 µm, as shown in α2 and β2 of FIG. 10, not only in the case where the width $W_1$ of the laminated structure 23D is small (for example, 3.2 µm) but also in the case where the width $W_1$ of the laminated structure 23D is large (for example, 4.5 µm), the difference between the mirror loss of the 0 order transverse mode and the mirror loss of the primary order transverse mode is able to be increased. That is, only by deviating the center point C2 of the laminated structure 23D from the opposed region C1, the difference between the mirror loss of the 0 order transverse mode and the mirror loss of the primary order transverse mode is able to be increased. Thereby, it is possible to obtain gain of the high-order transverse mode that is extremely smaller than gain of the fundamental transverse mode. Thus, high-order transverse mode oscillation is able to be prevented, and NFP is able to be in the shape of a top hat. The light output in the case where the width $W_1$ of the laminated structure 23D is large (for example, 4.5 µm) exceeds 90% of the light output in the case where the transverse mode adjustment section 23 is not provided on the upper DBR layer 16. Therefore, it is found that by setting the width $W_1$ of the laminated structure 23D to an appropriate size, it is possible to obtain high output of the high-order transverse mode while suppressing the high-order transverse mode oscillation. That is, in this embodiment, both light output and NFP are able to be satisfied.

The foregoing mirror loss is defined individually and respectively for the fundamental transverse mode and the primary transverse mode. Specifically, where a volume in a portion where a high reflectance area of the transverse mode adjustment section 23 (laminated structure 23D) and the fundamental transverse mode are overlapped is $V_o\,(_{high})$, a volume in a portion where the high reflectance area of the transverse mode adjustment section 23 (laminated structure 23D) and the primary mode are overlapped is $V_1\,(_{high})$, a volume in a portion a high reflectance area of the transverse mode adjustment section 23 (laminated structure 23D) and the fundamental transverse mode are not overlapped is $V_o\,(_{low})$, and a volume in a portion where the high reflectance area of the transverse mode adjustment section 23 (laminated structure 23D) and the primary mode are not overlapped is $V_1\,(_{low})$, mirror loss $\alpha_M\,(_{high})$ of the high reflectance area (laminated structure 23D) and mirror loss $\alpha_M\,(_{low})$ of a low reflectance area (portion other than the laminated structure 23D of the transverse mode adjustment section 23) are derived from Febry-Perot model as shown in the following Mathematical formulas 1 and 2. $V_o\,(_{high})$ and $V_1\,(_{low})$ are normalized for every mode as shown in the following Formulas 4 and 5.

$$\alpha_{M(high)} = \frac{1}{2L} \cdot L_n\left[\frac{1}{\sqrt{R_{t(high)} \cdot R_b}}\right] \quad \text{Mathematical formula 1}$$

$$\alpha_{M(low)} = \frac{1}{2L} \cdot L_n\left[\frac{1}{\sqrt{R_{t(low)} \cdot R_b}}\right] \quad \text{Mathematical formula 2}$$

$$V_{o(high)} + V_{0(low)} = 1 \quad \text{Formula 4}$$

$$V_{1(high)} + V_{1(low)} = 1 \quad \text{Formula 5}$$

Rb in Mathematical formulas 1 and 2 represents reflectance of the lower DBR layer 11. $R_t\,(_{high})$ represents reflectance of a high reflectance area of the upper DBR layer 16. $R_t\,(_{low})$ represents reflectance of a low reflectance area of the upper DBR layer 16. It is needless to say that, due to reflectance relation, $\alpha_M\,(_{high})$ is smaller than $\alpha_M\,(_{low})$.

Accordingly, mirror loss $\alpha^0{}_M$ of the fundamental transverse mode and mirror loss $\alpha^1{}_M$ of the primary transverse mode are as shown in the following Mathematical formula 3. As understood from Mathematical formula 3, in the case where the high reflectance area becomes larger, $V_o\,(_{high})$ and $V_1\,(_{high})$ become larger and $V_0\,(_{low})$ and $V_1\,(_{low})$ become smaller. Therefore $\alpha^0{}_M$ and $\alpha^1{}_M$ become smaller, and finally become equal to $\alpha_M\,(_{high})$.

$$\frac{1}{\alpha_M^m} = \frac{V_{m(high)}}{\alpha_{M(high)}} + \frac{V_{m(low)}}{\alpha_{M(low)}} \quad (m = 0, 1) \quad \text{Mathematical formula 3}$$

Further, in this embodiment, even in the case where the center point C2 of the laminated structure 23D is deviated from the opposed region C1, or in the case where the shape of the laminated structure 23D is a shape other than a circle (for example, in the shape of a convex or a cross), the center position of NFP corresponds with the center point C1 of the current injection region 15B, and NFP becomes circular irrespective of the shape of the laminated structure 23D. Therefore, there is no possibility that the general versatility of the laser diode 1 is lowered.

Further, in this embodiment, as described above, it is extremely easy to selectively etch the first adjustment layer 23A, and it is not necessary to form the first adjustment layer 23A, the second adjustment layer 23B, and the third adjustment layer 23C in a complicated shape. Therefore, the laser diode 1 is easily manufactured.

Further, in this embodiment, it is not necessary to use a special substrate, and it is not necessary to provide a component with a complicated shape and a complicated structure in the aperture of the upper electrode 19. Thus, the laser diode 1 is able to be easily and inexpensively manufactured. Further, it is not necessary to decrease the size of the mesa 18. Thus, it is possible to secure a large area of the current injection region 15B and the aperture of the upper electrode 19, and it is possible to obtain low resistance of the semiconductor layer 30 (resonator) and high output of the laser light. Therefore, a practical VCSEL is obtainable.

MODIFIED EXAMPLES

Figure 11A:
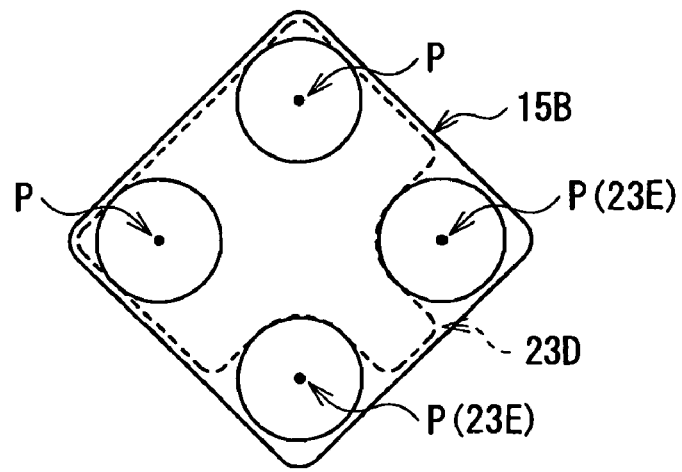
FIGS. 11A to 11C are schematic views for explaining a modified example of the transverse mode adjustment section of FIG. 2.
Figure 11B:
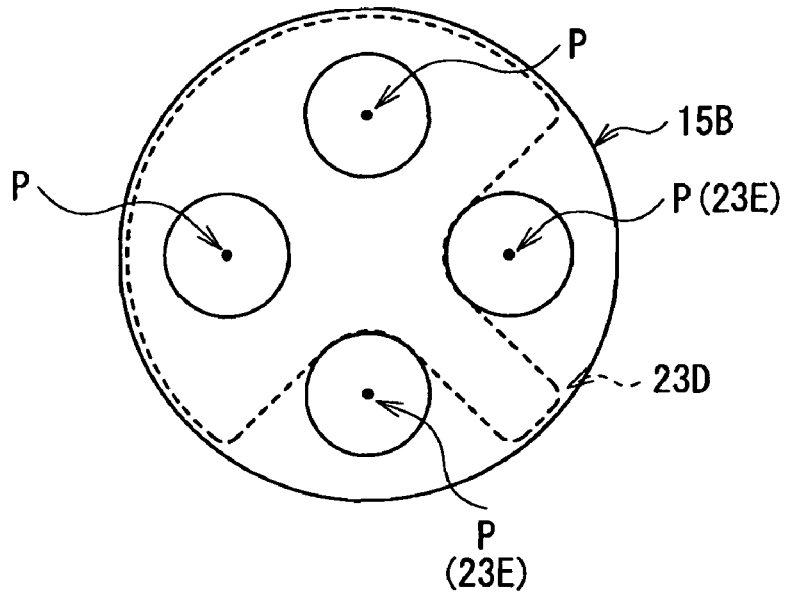
Figure 11C:
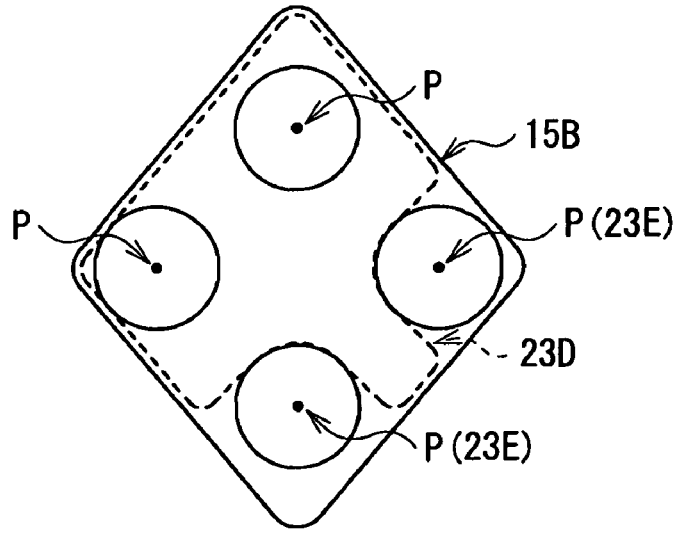
Figure 12A:
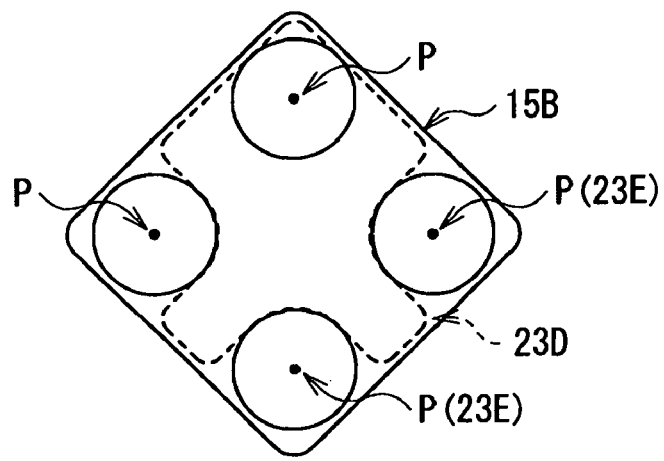
FIGS. 12A to 12C are schematic views for explaining another modified example of the transverse mode adjustment section of FIG. 2.
Figure 12B:
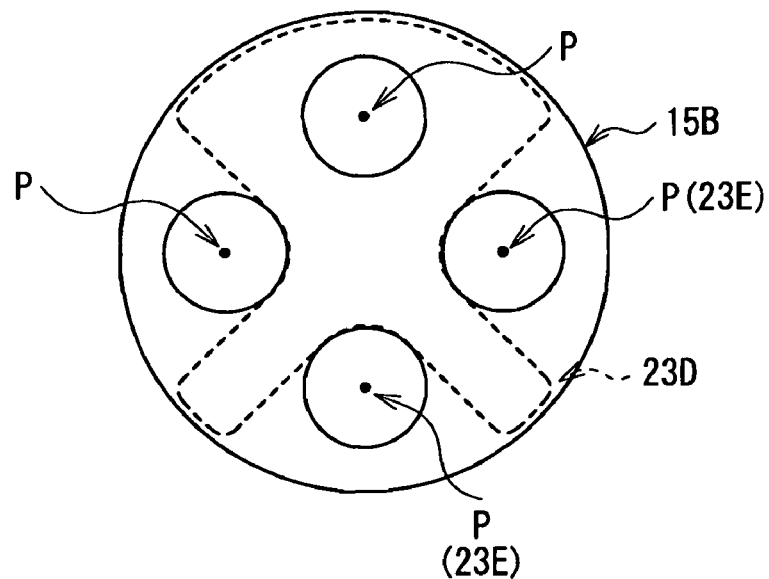
Figure 12C:
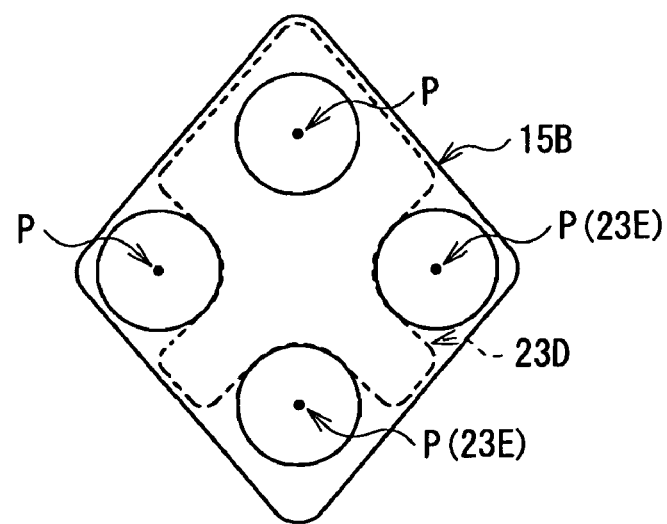

In the foregoing embodiment, the laminated structure 23D is circular. However, for example, as illustrated in FIGS. 11A to 11C, the laminated structure 23D may be in the shape of a convex protruding toward a region sandwiched between the specific regions 23E. Otherwise, for example, as illustrated in FIGS. 12A to 12C, the laminated structure 23D may be in the shape having double convexes protruding toward two regions sandwiched between the specific regions 23E. Further, for example, as illustrated in FIGS. 13A to 13C, the laminated structure 23D may be in the shape of a cross in the region other than the region corresponding to each peak P of the opposed region opposing to the current injection region 15B.

Figure 14:
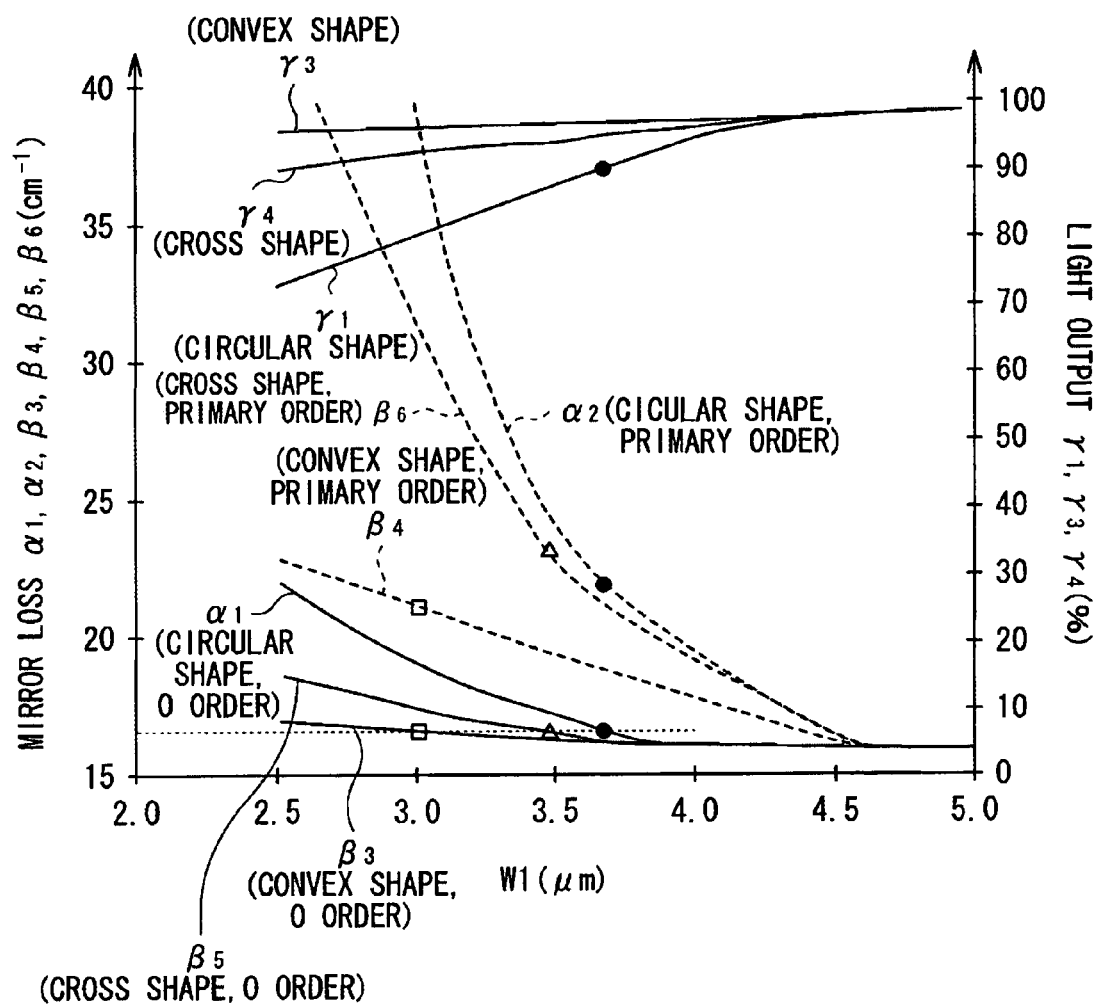
FIG. 14 is a characteristics diagram for explaining a relation between a width of the current confinement layer and mirror loss/light output in the case where the transverse mode adjustment sections of FIGS. 11A to 11C and FIGS. 13A to 13C are used.

For example, if the laminated structure 23D is circular, and the laminated structure 23D is arranged so that the center point C2 of the laminated structure 23D corresponds to the opposed region C1, as illustrated in FIG. 14, output of a simple transverse mode is able to be largest in the case where the width $W_1$ of the laminated structure 23D is about 3.65 μm. However, even in this case, the light output is about 90% of the light output in the case where the transverse mode adjustment section 23 is not provided on the upper DBR layer 16.

Meanwhile, for example, as illustrated in FIGS. 11A to 11C, in the case where the laminated structure 23D is in the shape of a convex and the width $W_1$ of the laminated structure 23D is about 3.0 μm, as illustrated in FIG. 14, the difference between the mirror loss of the 0 order transverse mode and the mirror loss of the primary transverse mode is able to be increased while the magnitude of mirror loss of the primary transverse mode is almost equal to that in the case where the laminated structure 23D is circular. Thereby, the gain of the high-order transverse mode is able to be extremely smaller than the gain of the fundamental transverse mode. Thus, the high-order transverse mode oscillation is able to be prevented, and NFP is able to be in the shape of a top hat. Further, compared to the case that the laminated structure 23D is circular, the light output is able to be increased up to about 96%.

Figure 13A:
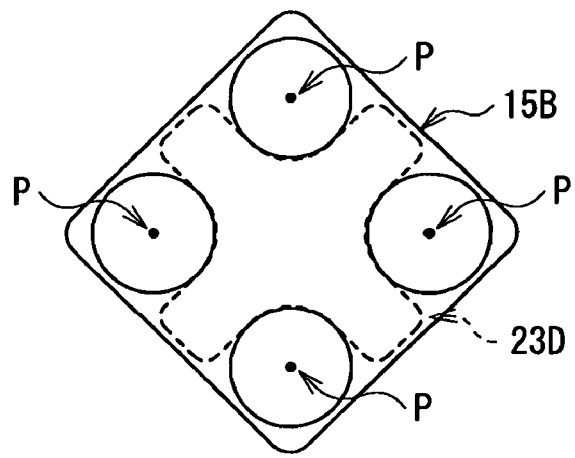
FIGS. 13A to 13C are schematic views for explaining still another modified example of the transverse mode adjustment section of FIG. 2.
Figure 13B:
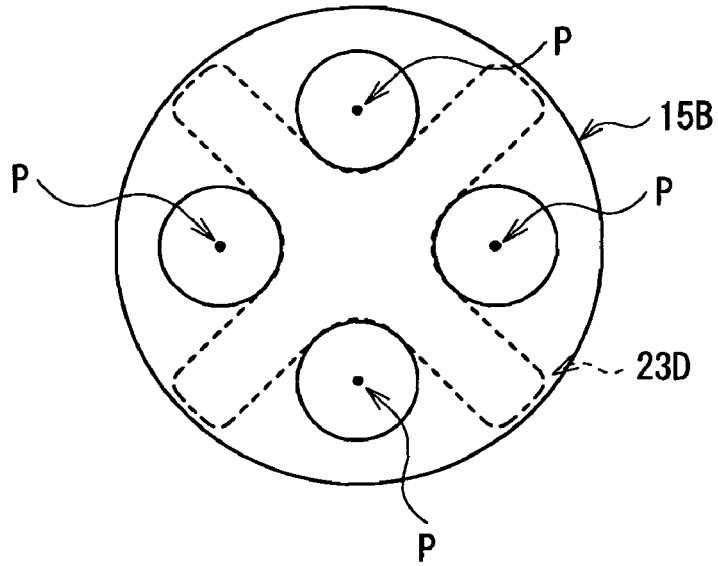
Figure 13C:
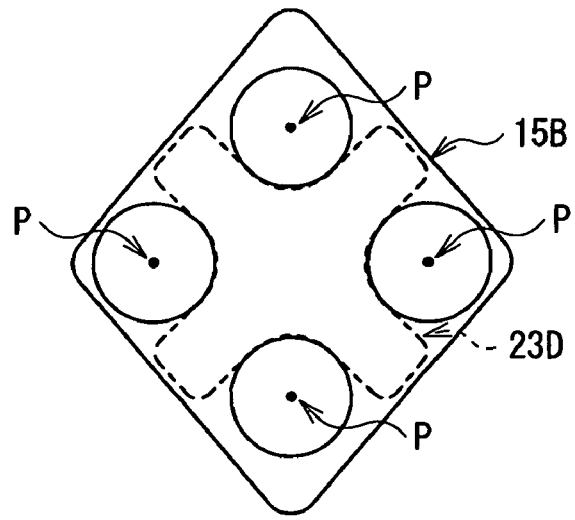

Further, for example, as illustrated in FIGS. 13A to 13C, in the case where the laminated structure 23D is in the shape of a cross and the width $W_1$ of the laminated structure 23D is about 3.5 μm, as illustrated in FIG. 14, the difference between the mirror loss of the 0 order transverse mode and the mirror loss of the primary transverse mode is able to be large while the magnitude of mirror loss of the primary transverse mode is almost equal to that in the case where the laminated structure 23D is circular. Thereby, the gain of the high-order transverse mode is able to be extremely smaller than the gain of the fundamental transverse mode. Thus, the high-order transverse mode oscillation is able to be prevented, and NFP is able to be in the shape of a top hat. Further, compared to the case that the laminated structure 23D is circular, the light output is able to be increased up to about 94%.

As described above, in the foregoing each modified example, the output of the fundamental transverse mode is able to be further increased, while oscillation of the high-order transverse mode is prevented.

In FIGS. 11A to 11C, FIGS. 12A to 12C, and FIGS. 13A to 13C, the width $W_1$ of the laminated structure 23D is a value twice the distance between the portion closest to the center point C1 of the current injection region 15B in the outer rim of the laminated structure 23D and the center point C1 of the current injection region 15B.

Descriptions have been hereinbefore given of the invention with reference to the embodiment and the modified examples. However, the invention is not limited to the foregoing embodiment and the like, and various modifications may be made.

For example, in the foregoing embodiment, the transverse mode adjustment section is composed of the first adjustment layer 23A, the second adjustment layer 23B, and the third adjustment layer 23C. However, the transverse mode adjustment section may have other structure. In short, any structure may be adopted as long as in the foregoing primary mode including the four peaks P of double rotation symmetry or quad rotation symmetry, at least one gain of a pair of peaks opposing with the opposed region C1 in between is prevented.

Further, in the foregoing embodiment and the like, the invention has been described with reference to the AlGaAs-based compound laser diode as an example. However, the invention is also applicable to other compound laser diodes such as a GaInP-based laser diode, an AlGaInP-based laser diode, an InGaAs-based laser diode, a GaInP-based laser diode, an InP-based laser diode, a GaN-based laser diode, a GaInN-based laser diode, and a GaInNAs-based laser diode.

It should be understood by those skilled in the art that various modifications, combinations, sub-combinations and alternations may occur depending on design requirements and other factors insofar as they are within the scope of the appended claims or the equivalents thereof.

What is claimed is:

1. A Vertical Cavity Surface Emitting Laser comprising:
    a semiconductor layer including an active layer and a current confinement layer; and
    a transverse mode adjustment section formed on the semiconductor layer, wherein
    the current confinement layer has a current injection region and a current confinement region,
    the transverse mode adjustment section has a high reflectance area and a low reflectance area,
    the high reflectance area is formed in a region including a first opposed region opposing to a center point of the current injection region, and has a shape of cross, and
    the low reflectance area is formed in a region where the high reflectance area is not formed, in an opposed region opposing to the current injection region.

2. The Vertical Cavity Surface Emitting Laser according to claim 1, the Vertical Cavity Surface Emitting Laser further comprising:
    a region generating a high order transverse mode including four peaks of double rotation symmetry or quad rotation symmetry,
    wherein the high reflectance area does not overlap in a depth direction a specific region, the specific region corresponding to two of the four peaks.

3. The Vertical Cavity Surface Emitting Laser according to claim 1, wherein
    the high reflectance area includes a first layer, the first layer being made of a first material having a thickness essentially equal to $(2a-1)\lambda/4n_1$, where
    a is an integer number of 1 or more,
    $\lambda$ is an oscillation wavelength, and
    $n_1$ is a refractive index of the first material.

4. The Vertical Cavity Surface Emitting Laser according to claim 3, wherein
    the refractive index of the first material is lower than a refractive index of a high refractive index layer provided between the layer of the high reflectance area and the current confinement layer.

5. The Vertical Cavity Surface Emitting Laser according to claim 1, wherein
    the first material is $SiO_2$.

6. The Vertical Cavity Surface Emitting Laser according to claim 3, wherein
    the high reflectance area includes a second layer, the second layer being made of a second material having a thickness essentially equal to $(2b-1)\lambda/4n_2$, where b is an integer number of 1 or more, λ is the oscillation wavelength, and $n_2$ is a refractive index of the second material.

7. The Vertical Cavity Surface Emitting Laser according to claim 6, wherein $n_2$ is greater than $n_1$.

8. The Vertical Cavity Surface Emitting Laser according to claim 7, wherein the second material is SiN.

9. The Vertical Cavity Surface Emitting Laser according to claim 7, wherein the low reflectance area includes a third layer, the third layer being made of a third material having a thickness essentially equal to $(2c-1)\lambda/4n_3$, where c is an integer number of 1 or more, λ is the oscillation wavelength, and $n_3$ is a refractive index of the third material.

10. The Vertical Cavity Surface Emitting Laser according to claim 9, wherein $n_3$ is greater than $n_1$.

11. The Vertical Cavity Surface Emitting Laser according to claim 9, wherein a thickness of the second layer and a thickness of the third layer are essentially equal.

12. The Vertical Cavity Surface Emitting Laser according to claim 9, wherein the second layer and the third layer are made of the same material.

13. A semiconductor laser comprising:

a semiconductor layer including an active layer and a current confinement layer, the current confinement layer including a current injection region; and a transverse mode adjustment section formed on the semiconductor layer, the transverse mode adjustment section including a high reflectance area and a low reflectance area, wherein the high reflectance area has the shape of a cross.

* * * * *